(12) United States Patent
Kikuhara

(10) Patent No.: US 11,212,630 B2
(45) Date of Patent: Dec. 28, 2021

(54) SIGNAL PROCESSING DEVICE

(71) Applicant: AUDIO-TECHNICA CORPORATION, Tokyo (JP)

(72) Inventor: Yasuhito Kikuhara, Tokyo (JP)

(73) Assignee: AUDIO-TECHNICA CORPORATION, Tokyo (JP)

(*) Notice: Subject to any disclaimer, the term of this patent is extended or adjusted under 35 U.S.C. 154(b) by 42 days.

(21) Appl. No.: 16/617,317

(22) PCT Filed: Mar. 15, 2018

(86) PCT No.: PCT/JP2018/010327
§ 371 (c)(1),
(2) Date: Nov. 26, 2019

(87) PCT Pub. No.: WO2018/220947
PCT Pub. Date: Dec. 6, 2018

(65) Prior Publication Data
US 2021/0136506 A1    May 6, 2021

(30) Foreign Application Priority Data
May 29, 2017    (JP) .............................. JP2017-106005

(51) Int. Cl.
*H04R 29/00* (2006.01)
*H03F 1/32* (2006.01)
*H04R 3/00* (2006.01)

(52) U.S. Cl.
CPC .......... *H04R 29/008* (2013.01); *H03F 1/3264* (2013.01); *H04R 3/00* (2013.01); *H04R 2420/01* (2013.01); *H04R 2430/01* (2013.01)

(58) Field of Classification Search
CPC .... H04R 29/008; H04R 3/00; H04R 2420/01; H04R 2430/01; H03F 1/3264
(Continued)

(56) References Cited

U.S. PATENT DOCUMENTS 8,183,997 B1    5/2012 Wong et al.
2005/0047605 A1*  3/2005 Lee ...................... H04R 29/008
                                                     381/56
(Continued)

FOREIGN PATENT DOCUMENTS

JP    2001 078300 A    3/2001
JP    2001 0783200 A    3/2001
(Continued)

*Primary Examiner* — Disler Paul
(74) *Attorney, Agent, or Firm* — W&C IP

(57) ABSTRACT

The present invention provides a signal processing device that allows a user, who adjusts a signal level to match a reference level, to adjust the signal level while checking a degree of difference between the signal level and the reference level.

A signal processing device according to the present invention comprises: an input part 20 to which an input signal is input; a storage 40 that stores therein one or more setting values of a parameter to be used for amplifying the input signal and a reference value of the setting value; an amplification part 30 that generates an output signal by amplifying a level of the input signal based on the setting value; an output part 70 that outputs the output signal; an adjustment part 50 that adjusts the setting value; and a display 60 that displays a display result determined based on the setting value adjusted by the adjustment part and the reference value. The display result displayed on the display 60 includes: a specific display result displayed when a relation between the setting value and the reference value is a specific relation; and a non-specific display result displayed when the relation between the setting value and the reference value is different from the specific relation.

2 Claims, 15 Drawing Sheets

(58) Field of Classification Search
USPC .................. 381/56, 109, 119, 103, 306, 388
See application file for complete search history.

(56) References Cited

U.S. PATENT DOCUMENTS

| | | | |
|---|---|---|---|
| 2012/0230513 A1* | 9/2012 | Yoneda .................... | H04R 3/02 |
| | | | 381/96 |
| 2012/0230514 A1* | 9/2012 | Yoneda .................... | H04R 3/04 |
| | | | 381/96 |
| 2014/0334648 A1* | 11/2014 | Wang ................... | H05B 47/195 |
| | | | 381/150 |
| 2016/0004405 A1 | 1/2016 | Kim et al. | |
| 2018/0353152 A1* | 12/2018 | Teji ........................ | A61B 7/003 |

FOREIGN PATENT DOCUMENTS

| | | |
|---|---|---|
| JP | 2003-069407 A | 3/2003 |
| JP | 2003-99038 A | 4/2003 |
| JP | 3 951655 B2 | 8/2007 |
| JP | 2011-239019 A | 11/2011 |
| JP | 2012-209766 A | 10/2012 |
| WO | 2016/090342 A2 | 6/2016 |

\* cited by examiner

| Gain value [dB] | Indicating lamp | Display mode of indicating lamp |
|---|---|---|
| +21 | 1 | Unlighted |
| +22 | 1 | Dimmer 1 lighted-up |
| +23 | 1 | Dimmer 2 lighted-up |
| +24 | 1 | Lighted-up |
| +25 | 2 | Dimmer 1 lighted-up |
| +26 | 2 | Dimmer 2 lighted-up |
| +27 | 2 | Lighted-up |
| +28 | 3 | Dimmer 1 lighted-up |
| +29 | 3 | Dimmer 2 lighted-up |
| +30 | 3 | Lighted-up |
| +31 | 4 | Dimmer 1 lighted-up |
| +32 | 4 | Dimmer 2 lighted-up |
| +33 | 4 | Lighted-up |
| +34 | 5 | Dimmer 1 lighted-up |
| +35 | 5 | Dimmer 2 lighted-up |
| +36 | 5 | Lighted-up |
| +37 | 6 | Dimmer 1 lighted-up |
| +38 | 6 | Dimmer 2 lighted-up |
| +39 | 6 | Lighted-up |
| +40 | 7 | Lighted-up when gain value is first reference value +40dB<br>Flashing when gain value is more or less +40dB |
| +41 | 7 | Flashing |
| +42 | 7 | Flashing |
| +43 | 8 | Dimmer 1 lighted-up |
| +44 | 8 | Dimmer 2 lighted-up |
| +45 | 8 | Lighted-up |
| +46 | 9 | Dimmer 1 lighted-up |
| +47 | 9 | Dimmer 2 lighted-up |
| +48 | 9 | Lighted-up |
| +49 | 10 | Dimmer 1 lighted-up |
| +50 | 10 | Dimmer 2 lighted-up |
| +51 | 10 | Lighted-up |
| +52 | 11 | Dimmer 1 lighted-up |
| +53 | 11 | Dimmer 2 lighted-up |
| +54 | 11 | Lighted-up |
| +55 | 12 | Dimmer 1 lighted-up |
| +56 | 12 | Dimmer 2 lighted-up |
| +57 | 12 | Lighted-up |
| +58 | 13 | Dimmer 1 lighted-up |
| +59 | 13 | Dimmer 2 lighted-up |
| +60 | 13 | Lighted-up |

FIG. 7

| Sound signal level [dBFS] | Indicating lamp | Display mode of indicating lamp |
|---|---|---|
| less -56 | 1 | Lighted-up |
| -56 ~ -48 | 2 | Dimmer 1 lighted-up |
| -48 ~ -40 | 2 | Dimmer 2 lighted-up |
| -40 ~ -36 | 2 | Lighted-up |
| -36 ~ -34 | 3 | Dimmer 1 lighted-up |
| -34 ~ -33 | 3 | Dimmer 2 lighted-up |
| -33 ~ -32 | 3 | Lighted-up |
| -32 ~ -31 | 4 | Dimmer 1 lighted-up |
| -31 ~ -30 | 4 | Dimmer 2 lighted-up |
| -30 ~ -29 | 4 | Lighted-up |
| -29 ~ -28 | 5 | Dimmer 1 lighted-up |
| -28 ~ -26 | 5 | Dimmer 2 lighted-up |
| -26 ~ -25 | 5 | Lighted-up |
| -25 ~ -24 | 6 | Dimmer 1 lighted-up |
| -24 ~ -23 | 6 | Dimmer 2 lighted-up |
| -23 ~ -22 | 6 | Lighted-up |
| -22 ~ -18 | 7 | Lighted-up when sound signal value is second reference value -22dBFS to -18dBFS<br>Flashing when sound signal value is more or less -22dBFS to -18dBFS |
| -18 ~ -17 | 8 | Dimmer 1 lighted-up |
| -17 ~ -16 | 8 | Dimmer 2 lighted-up |
| -16 ~ -15 | 8 | Lighted-up |
| -15 ~ -14 | 9 | Dimmer 1 lighted-up |
| -14 ~ -13 | 9 | Dimmer 2 lighted-up |
| -13 ~ -12 | 9 | Lighted-up |
| -12 ~ -11 | 10 | Dimmer 1 lighted-up |
| -11 ~ -10 | 10 | Dimmer 2 lighted-up |
| -10 ~ -9 | 10 | Lighted-up |
| -9 ~ -8 | 11 | Dimmer 1 lighted-up |
| -8 ~ -7 | 11 | Dimmer 2 lighted-up |
| -7 ~ -6 | 11 | Lighted-up |
| -6 ~ -5 | 12 | Dimmer 1 lighted-up |
| -5 ~ -4 | 12 | Dimmer 2 lighted-up |
| -4 ~ -3 | 12 | Lighted-up |
| -3 or greater | 13 | Lighted-up |

FIG. 13

| Input level value [dBu] | Indicating lamp | Display mode of indicating lamp |
|---|---|---|
| $-\infty$ | 1 | Unlighted |
| -80 | 1 | Dimmer 1 lighted-up |
| -70 | 1 | Dimmer 2 lighted-up |
| -60 | 1 | Lighted-up |
| -56 | 2 | Dimmer 1 lighted-up |
| -52 | 2 | Dimmer 2 lighted-up |
| -48 | 2 | Lighted-up |
| -44 | 3 | Dimmer 1 lighted-up |
| -40 | 3 | Dimmer 2 lighted-up |
| -36 | 3 | Lighted-up |
| -33 | 4 | Dimmer 1 lighted-up |
| -30 | 4 | Dimmer 2 lighted-up |
| -28 | 4 | Lighted-up |
| -26 | 5 | Dimmer 1 lighted-up |
| -24 | 5 | Dimmer 2 lighted-up |
| -22 | 5 | Lighted-up |
| -20 | 6 | Dimmer 1 lighted-up |
| -18 | 6 | Dimmer 2 lighted-up |
| -16 | 6 | Lighted-up |
| -14 | 7 | Dimmer 1 lighted-up |
| -12 | 7 | Dimmer 2 lighted-up |
| -10 | 7 | Lighted-up |
| -8 | 8 | Dimmer 1 lighted-up |
| -7 | 8 | Dimmer 2 lighted-up |
| -6 | 8 | Lighted-up |
| -5 | 9 | Dimmer 1 lighted-up |
| -4 | 9 | Dimmer 2 lighted-up |
| -3 | 9 | Lighted-up |
| -2 | 10 | Flashing |
| -1 | 10 | Flashing |
| 0 | 10 | Lighted-up when input level value is third reference value 0 dBu<br>Flashing when input level value is more or less 0 dBu |
| +1 | 11 | Dimmer 1 lighted-up |
| +2 | 11 | Dimmer 2 lighted-up |
| +3 | 11 | Lighted-up |
| +4 | 12 | Dimmer 1 lighted-up |
| +5 | 12 | Dimmer 2 lighted-up |
| +6 | 12 | Lighted-up |
| +7 | 13 | Dimmer 1 lighted-up |
| +8 | 13 | Dimmer 2 lighted-up |
| +10 | 13 | Lighted-up |

FIG. 18

| Output level value [dBu] | Indicating lamp | Display mode of indicating lamp |
|---|---|---|
| -∞ | 1 | Unlighted |
| -80 | 1 | Dimmer 1 lighted-up |
| -70 | 1 | Dimmer 2 lighted-up |
| -60 | 1 | Lighted-up |
| -56 | 2 | Dimmer 1 lighted-up |
| -52 | 2 | Dimmer 2 lighted-up |
| -48 | 2 | Lighted-up |
| -44 | 3 | Dimmer 1 lighted-up |
| -40 | 3 | Dimmer 2 lighted-up |
| -36 | 3 | Lighted-up |
| -33 | 4 | Dimmer 1 lighted-up |
| -30 | 4 | Dimmer 2 lighted-up |
| -28 | 4 | Lighted-up |
| -26 | 5 | Dimmer 1 lighted-up |
| -24 | 5 | Dimmer 2 lighted-up |
| -22 | 5 | Lighted-up |
| -20 | 6 | Dimmer 1 lighted-up |
| -18 | 6 | Dimmer 2 lighted-up |
| -16 | 6 | Lighted-up |
| -14 | 7 | Dimmer 1 lighted-up |
| -12 | 7 | Dimmer 2 lighted-up |
| -10 | 7 | Lighted-up |
| -8 | 8 | Dimmer 1 lighted-up |
| -7 | 8 | Dimmer 2 lighted-up |
| -6 | 8 | Lighted-up |
| -5 | 9 | Dimmer 1 lighted-up |
| -4 | 9 | Dimmer 2 lighted-up |
| -3 | 9 | Lighted-up |
| -2 | 10 | Flashing |
| -1 | 10 | Flashing |
| 0 | 10 | Lighted-up when output level value is fourth reference value 0 dBu<br>Flashing when output level value is more or less 0 dBu |
| +1 | 11 | Dimmer 1 lighted-up |
| +2 | 11 | Dimmer 2 lighted-up |
| +3 | 11 | Lighted-up |
| +4 | 12 | Dimmer 1 lighted-up |
| +5 | 12 | Dimmer 2 lighted-up |
| +6 | 12 | Lighted-up |
| +7 | 13 | Dimmer 1 lighted-up |
| +8 | 13 | Dimmer 2 lighted-up |
| +10 | 13 | Lighted-up |

FIG. 20

SIGNAL PROCESSING DEVICE

TECHNICAL FIELD

The present invention relates to a signal processing device.

BACKGROUND ART

A signal processing device, such as a mixer, performs, for example, mixing, distributing and adjusting balance of input signals input from a plurality of input devices. In order to prevent clipping of a signal and a decrease in signal-to-noise (S/N) ratio, the signal processing device is used with a signal level of an input signal and a signal level of an output signal adjusted to match reference values. The signal processing device includes a front panel, an adjustment dial that adjusts a signal level, and a scale that displays a signal level of the adjusted signal, for example. A user of the signal processing device checks whether the signal level matches a reference level by rotating the adjustment dial while observing the scale.

As the number of targets to be adjusted with one adjustment dial increases, the scale is required for the respective targets. When one scale for the respective targets is required on the front panel, arranging all needed scales on the front panel is difficult. Even if all the required scales can be arranged on the front panel, the display of the scales is complicated and the design is degraded. Consequently, checking the result of adjustment can be difficult for a user of the signal processing device.

Signal processing devices have been proposed to allow a signal level to be adjusted to a reference level without observing a scale (see, Japanese Unexamined Patent Application Publication No. 2003-069407). The signal processing device, which is disclosed in Japanese Unexamined Patent Application Publication No. 2003-069407, lights up an indicator or causes the indicator to flash only when difference between the signal level and the reference level falls within a certain range. That is, a user can recognize that the difference between the signal level and the reference value reaches a value within the certain range from lighted-up or flashing of the indicator.

SUMMARY OF INVENTION

Technical Problem

However, with the signal processing device disclosed in Japanese Unexamined Patent Application Publication No. 2003-069407, a user cannot check a degree of the difference between the signal level and the reference level when the indicator is lighted off.

An object of the present invention is to solve the problem described above and to provide a signal processing device that allows a user, who adjusts a signal level to match a reference level, to adjust the signal level while checking the degree of difference between the signal level and the reference level.

Solution to Problem

The signal processing device according to the present invention comprises: an input part to which an input signal is input; a storage that stores therein one or more setting values of a parameter to be used for amplifying the input signal, and a reference value of the setting value; an amplification part that generates an output signal by amplifying a level of the input signal based on the setting value; an output part that outputs the output signal; an adjustment part that adjusts the setting value; and a display that displays a display result determined based on the setting value adjusted by the adjustment part and the reference value. The display result includes: a specific display result displayed when a relation between the setting value and the reference value is a specific relation; and a non-specific display result displayed when the relation between the setting value and the reference value is different from the specific relation.

Advantageous Effects of Invention

According to the present invention, a signal processing device that allows a user, who adjusts a signal level to match a reference level, to adjust the signal level while checking a degree of difference between the signal level and the reference level can be provided.

BRIEF DESCRIPTION OF DRAWINGS

FIG. 3 is a front view of the signal processing device illustrated in

FIG. 1.

FIG. 7 is a schematic view illustrating an example of display mode information used in the first gain adjustment processing illustrated in FIG. 6.

FIG. 13 is a schematic view illustrating an example of display mode information used in the second gain adjustment processing illustrated in FIG. 12.

FIG. 18 is a schematic view illustrating an example of display mode information used in the input level adjustment processing illustrated in FIG. 17.

FIG. 20 is a schematic view illustrating an example of display mode information used in the output level adjustment processing illustrated in FIG. 18.

DESCRIPTION OF EMBODIMENTS

Embodiments of a signal processing device according to the present invention will now be described with reference to the attached drawings.

Configuration of Signal Processing Device

Figure 1:
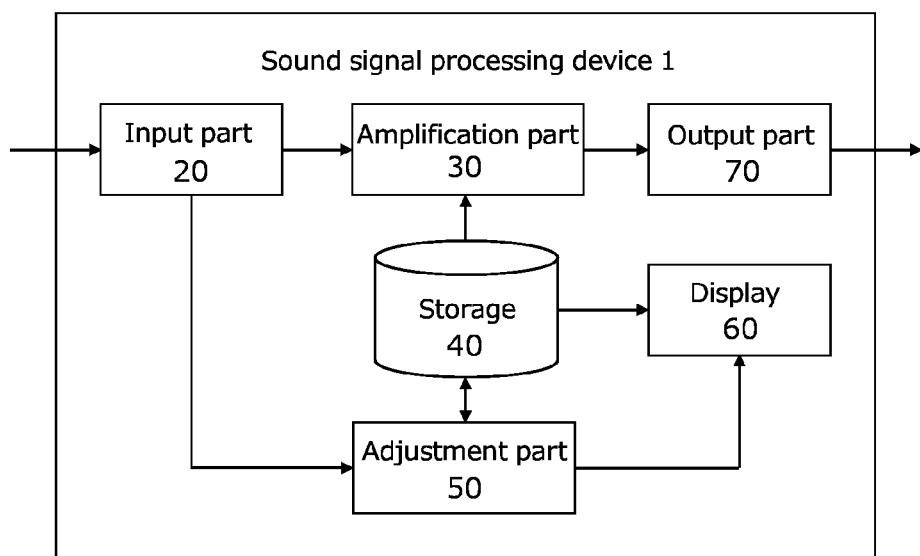
FIG. 1 is a functional block diagram illustrating an embodiment of a signal processing device according to the present invention.

FIG. 1 is a functional block diagram illustrating an embodiment of a signal processing device according to the present invention (hereinafter referred to as "the present device").

The following explanation describes, as an example, a digital mixer including: a plurality of input channels to which input devices are connected; and a plurality of output channels to which output devices are connected, the digital mixer that amplifies sound signals input from the input channels and outputs the amplified signals from the output channels. That is, the digital mixer is an example of the present device.

The present device 1 includes an input part 20, an amplification part 30, a storage 40, an adjustment part 50, a display 60, and an output part 70.

The input part 20 receives an input signal from an input device (not illustrated) such as a microphone, for example.

The amplification part 30 amplifies the input signal from the input part 20 based on a setting value of each parameter and generates an output signal.

The setting value of each parameter is a value of each parameter used by the present device 1 to amplify an input signal. Parameters used by the present device 1 to amplify an input signal include an input level set for each input channel, an output level set for each output channel, and gain. That is, the setting values of the parameters used by the present device 1 to amplify an input signal are an input level value, an output level value, and a gain value. The present device 1 amplifies the input signal based on setting values of respective parameters that have been adjusted and set by a below-mentioned method.

Figure 2:
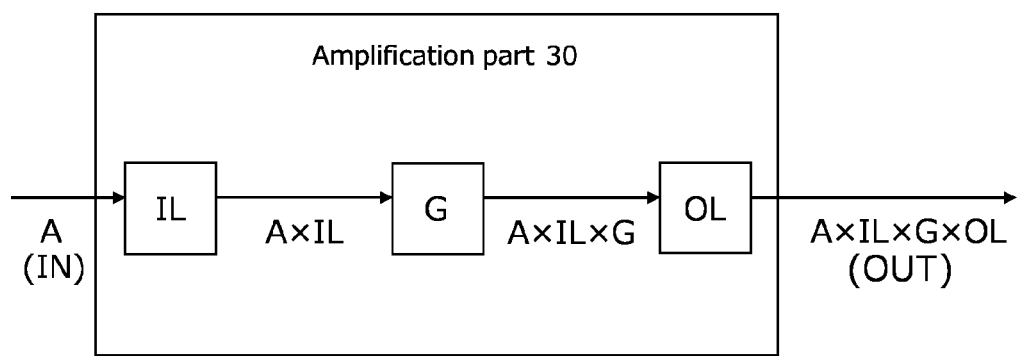
FIG. 2 is a schematic view illustrating amplification of an input signal by an amplification part included in the signal processing device illustrated in FIG. 1.

FIG. 2 is a schematic view illustrating amplification of the input signal by the amplification part 30.

FIG. 2 illustrates that level A of an input signal from the input part 20 is amplified to "A×IL" based on input level value IL set for an input channel, further amplified to "A×IL×G" based on gain value G, still further amplified to "A×IL×G×OL" based on output level value OL set for an output channel, and then the amplified signal is output.

"A×IL×G×OL" is the level of the output signal generated from the input signal amplified by the present device 1.

Referring back to FIG. 1, the storage 40 stores therein information required for the present device 1 to operate, such as a setting value, a reference value of the setting value, and display mode information of each parameter.

The reference value of the setting value of each parameter is a value of the parameter used by the present device 1 to adjust the setting value. The present device 1 uses a first reference value that is referred to in first gain adjustment processing, a second reference value that is referred to in second gain adjustment processing, a third reference value that is referred to in input level adjustment processing, and a fourth reference value that is referred to in output level adjustment processing. Details of the adjustment processing and the respective reference values will be described later.

The display mode information of each parameter is information that indicates, for each parameter, a combination of a setting value, a reference value, and a display result displayed on the display 60 based on the relation between the setting value and the reference value.

The adjustment part 50 adjusts a setting value of each parameter.

The display 60 displays, for each parameter, a display result determined based on a setting value adjusted by the adjustment part 50, a reference value, and display mode information.

Display result includes a specific display result displayed (obtained) when the relation between a setting value and a reference value is a specific relation, and a non-specific display result displayed (obtained) when the relation between the setting value and the reference value is different from the specific relation. The specific relation, in the present embodiment, means a relation in which the setting value matches the reference value. The specific display result, in the present embodiment, means a display result displayed in a display mode (specific display mode) in which an indicating lamp corresponding to the reference value is lighted up. The non-specific display result, in the present embodiment, means a display result displayed in a display mode (non-specific display mode) in which one or more indicating lamps corresponding to the reference value are flashing.

It should be noted that, in the present invention, the specific relation may be a relation in which the difference between the setting value and the reference value is within a certain range. The specific display result may be displayed in this case alone.

The output part 70 outputs an output signal generated by the amplification part 30 to an external device (not illustrated) such as a speaker, for example.

Figure 3:
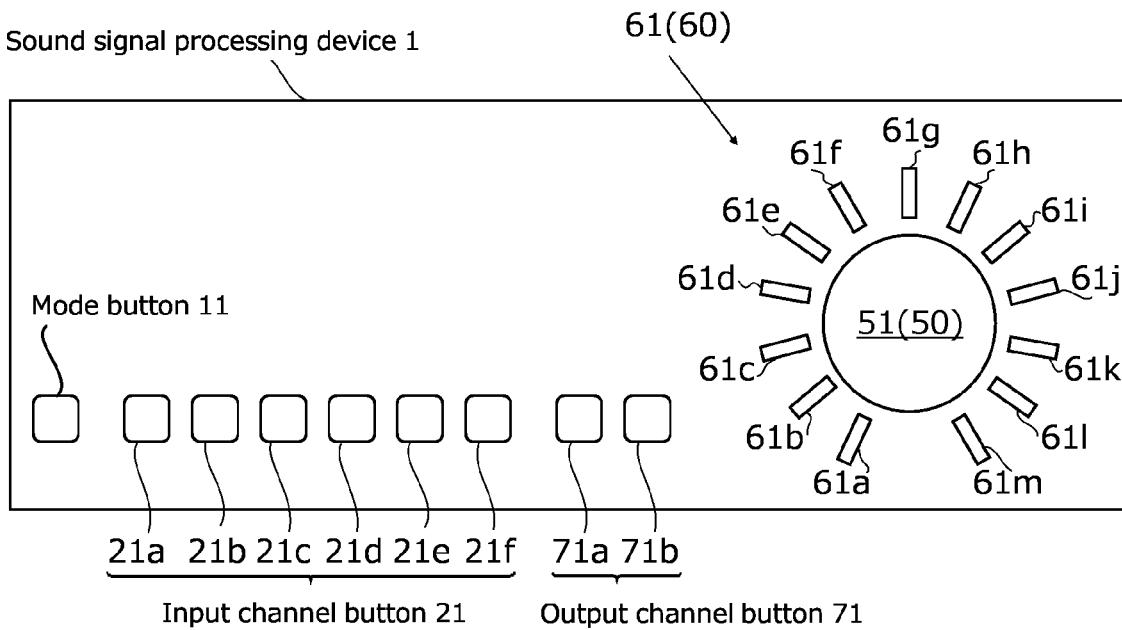

FIG. 3 is a front view of the present device 1.

The present device 1 includes: a mode button 11; input channel buttons 21 (21a, 21b, 21c, 21d, 21e and 210 for respective input channels; output channel buttons 71 (71a and 71b) for respective output channels; an adjustment dial 51 included in the adjustment part 50; and indicating lamps 61 (61a, 61b, 61c, 61d, 61e, 61f, 61g, 61h, 61i, 61j, 61k, 61l and 61m) included in the display 60. FIG. 3 illustrates that the present device 1 includes six input channel buttons 21, two output channel buttons 71, and 13 indicating lamps 61.

Among the indicating lamps 61, an indicating lamp that flashes in the non-specific display mode is the indicating lamp 61g corresponding to a reference value as will be described later. That is, the indicating lamp 61g corresponding to the reference value is a specific indicating lamp.

The mode button 11 is a button pressed down by a user of the present device 1 to switch an operation mode of the present device 1. The operation mode of the present device 1 includes a working mode and an adjustment mode. The adjustment mode includes a gain adjustment mode and a level adjustment mode.

The present device 1 operating in the working mode amplifies an input signal input from an input device via an input channel based on a setting value of each parameter that has been adjusted (set), and generates an output signal. The present device 1 operating in the working mode outputs the generated output signal via an output channel. A combination of the input channel and the output channel through which the output signal is output has been set in advance by a user of the present device 1 by operating an input member (not illustrated) of the present device 1, and stored in the storage 40.

The present device 1 operating in the adjustment mode performs the gain adjustment processing and the level adjustment processing which are described later.

While operating in the adjustment mode, the present device 1 switches between the gain adjustment processing and the level adjustment processing when the user presses down the mode button 11. That is, the present device 1 operates in the working mode when power is turned on, for example. When the mode button 11 is pressed down by a user while the present device 1 is operating in the working mode, the operation mode of the present device 1 switches to the adjustment mode, and then the present device 1 can perform the first gain adjustment processing included in the gain adjustment processing. When the mode button 11 is pressed down by a user while the first gain adjustment processing is performable (including while the first gain adjustment processing is in process; the same applies below), the present device 1 can perform the second gain adjustment processing included in the gain adjustment processing. When the mode button 11 is pressed down by a user while the second gain adjustment processing is performable, the present device 1 can perform the input level adjustment processing included in the level adjustment processing. When the mode button 11 is pressed down by a user while the input level adjustment processing is performable, the present device 1 can perform the output level adjustment processing. When the mode button 11 is pressed down by a user while the output level adjustment processing is performable, the operation mode of the present device 1 switches to the working mode.

As described above, each time the mode button 11 is pressed down, the operation mode of the present device 1 switches from "working mode" to "adjustment mode" (from "first gain adjustment processing" to "second gain adjustment processing" to "input level adjustment processing" and to "output level adjustment processing") and to "working mode". Specific details of each adjustment processing will be described later.

Each of the input channel buttons 21 is a button pressed down by a user of the present device 1 to select an input channel to which an input device to be subjected to adjustment, among input devices connected to the present device 1, is connected.

Each of the output channel buttons 71 is a button pressed down by a user of the present device 1 to select an output channel to which an external device to be subjected to adjustment, among external devices connected to the present device 1, is connected.

The adjustment dial 51 is a dial rotated by a user of the present device 1 to adjust a setting value of a parameter.

When the adjustment dial 51 is rotated, the resistance value of a variable resistor (not illustrated) included in the present device 1 changes. The present device 1 measures the setting value of the parameter being adjusted based on the magnitude of the resistance value. Information required for the present device 1 to identify the setting value of the parameter after the adjustment dial 51 is rotated, such as the correspondence relation between the resistance value and the setting value of the parameter, is stored in the storage 40. The setting value adjusted with the adjustment dial 51 corresponds to the magnitude of the resistance value of the variable resistor.

The indicating lamp 61 displays a display result determined based on a setting value adjusted with the adjustment dial 51, a reference value, and display mode information.

Adjustment Processing by the Present Device

The following describes adjustment processing of a setting value of each parameter performed by the present device 1.

Figure 4:
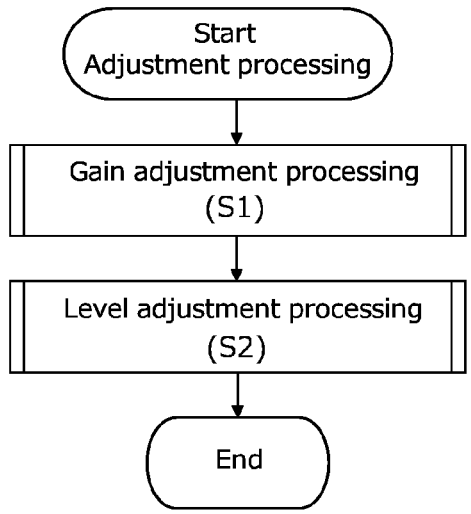
FIG. 4 is a flow chart illustrating adjustment processing of a setting value performed by the signal processing device illustrated in FIG. 1.

FIG. 4 is a flow chart illustrating adjustment processing of a setting value.

First, the present device 1 performs the gain adjustment processing (S1). Specific details of the gain adjustment processing (S1) will be described later.

Then, the present device 1 performs the level adjustment processing (S2). Specific details of the level adjustment processing (S2) will be described later.

Gain Adjustment Processing

The following describes the gain adjustment processing (S1).

The gain adjustment processing (S1) is processing for adjusting the amplification factor (gain value) of each input channel.

Figure 5:
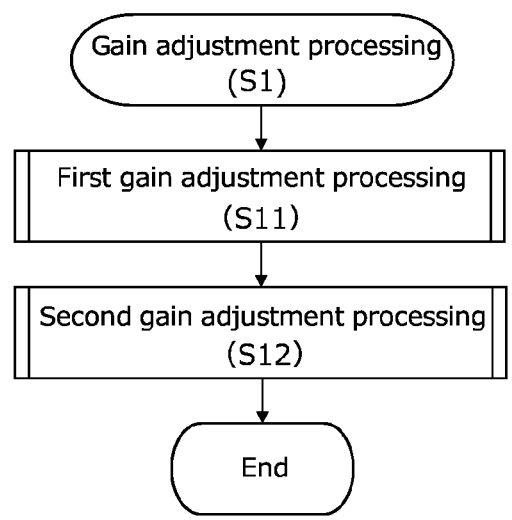
FIG. 5 is a flow chart illustrating gain adjustment processing included in the adjustment processing illustrated in FIG. 4.

FIG. 5 is a flow chart illustrating the gain adjustment processing (S1).

First, the present device 1 performs the first gain adjustment processing (S11). Specific details of the first gain adjustment processing (S11) will be described later.

Then, the present device 1 performs the second gain adjustment processing (S12). Specific details of the second gain adjustment processing (S12) will be described later.

First Gain Adjustment Processing

The following describes the first gain adjustment processing (S11).

The first gain adjustment processing (S11) is processing for adjusting a gain value (the present gain value), which has been set for each input channel and stored in the storage 40, such that the present gain value matches the first reference value. The present gain value of each input channel has been stored in the storage 40.

Figure 6:
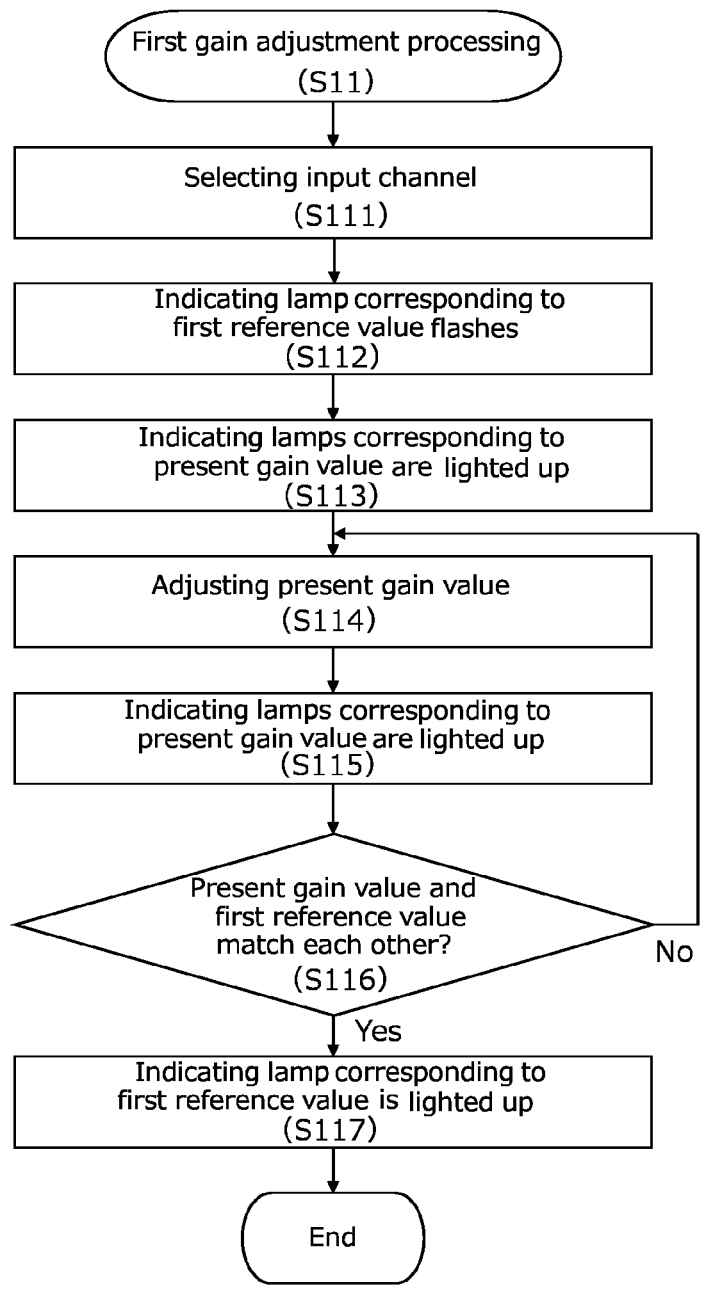
FIG. 6 is a flow chart illustrating first gain adjustment processing included in the gain adjustment processing illustrated in FIG. 5.

FIG. 6 is a flow chart illustrating the first gain adjustment processing (S11).

First, the present device 1 selects an input channel to be subjected to adjustment (S111). That is, the present device 1 selects, as an input channel to be subjected to adjustment, an input channel corresponding to one of the input channel buttons 21 pressed down by the user.

Then, the present device 1 causes one of the indicating lamps 61 corresponding to the first reference value to flash (S112). At the same time, the present device 1 lights up one of the indicating lamps 61 corresponding to the present gain value of the selected input channel (S113).

FIG. 7 is a schematic view illustrating display mode information used in the first gain adjustment processing (S11).

FIG. 7 illustrates that gain values, information identifying the indicating lamps 61, and display modes of the indicating lamps 61 are stored in the storage 40 in a manner associated with one another.

As illustrated in FIG. 3, the information identifying the indicating lamps 61 indicates that "1" is the first indicating lamp 61a, "2" is the second indicating lamp 61b, "3" is the third indicating lamp 61c, "4" is the fourth indicating lamp 61d, "5" is the fifth indicating lamp 61e, "6" is the sixth indicating lamp 61f, "7" is the seventh indicating lamp 61g, "8" is the eighth indicating lamp 61h, "9" is the ninth indicating lamp 61i, "10" is the tenth indicating lamp 61j, "11" is the eleventh indicating lamp 61k, "12" is the twelfth indicating lamp 61l, and "13" is the thirteenth indicating lamp 61m. In the following, the indicating lamps are simply described as the "indicating lamp(s) 61" unless a specified indicating lamp is described.

FIG. 7 illustrates that one indicating lamp 61 corresponds to a plurality of gain values (among the 13 indicating lamps 61a to 61m, the first indicating lamp 61a corresponds to four gain values, and the other indicating lamps 61b to 61m correspond to three gain values), and to display modes corresponding to the respective gain values. That is, the display modes of the fifth indicating lamp 61e (the indicating lamp "5" in FIG. 7) are "dimmer 1 lighted-up" when the gain value is "+34 dB", "dimmer 2 lighted-up" when the gain value is "+35 dB", and "lighted-up" when the gain value is "+36 dB", for example. A dimmer is dimmed brightness of the indicating lamp 61. In the mode "dimmer 1 lighted-up", the indicating lamp 61 lights up with dimmed brightness b1. In the mode "dimmer 2 lighted-up", the indicating lamp 1 lights up with dimmed brightness b2. In the mode "lighted-up", the indicating lamp 61 lights up with brightness b3 that is not dimmed. The relation among the brightness b1 to b3 is b1<b2<b3. That is, the display mode of the indicating lamp 61 differs depending on the corresponding gain value (setting value).

It should be noted that the gain values corresponding to one indicating lamp and the display modes corresponding to the respective gain values are not limited to dimmer lighted-up. That is, the gain values corresponding to one indicating lamp and the display modes corresponding to the respective gain values may be such that the indicating lamp is lighted up with a different light color depending on the gain value, for example.

FIG. 7 further illustrates that the first reference value is "+40 dB". FIG. 7 illustrates that the display mode of the "seventh indicating lamp 61g" corresponding to the first reference value "+40 dB" is "lighted-up" when the present gain value matches the first reference value, and is "flashing" when the present gain value is a value other than the first reference value. That is, the display mode of the seventh indicating lamp 61g corresponding to the first reference value repeats "flashing" until the present gain value matches the first reference value, and changes to "lighted-up" when the present gain value matches the first reference value, as will be described later. A user of the present device 1 can recognize that the present gain value has matched the first reference value from the change of the seventh indicating lamp 61g, among the indicating lamps 61a to 61m, from flashing to lighted-up. That is, the user of the present device 1 can recognize that adjustment of the gain value in the first gain adjustment processing has been completed.

When the indicating lamp 61 corresponding to the present gain value is the "fifth indicating lamp 61e", the display mode of the "first indicating lamp 61a", the "second indicating lamp 61b", the "third indicating lamp 61c", and the "fourth indicating lamp 61d", which correspond to smaller gain values than the present gain value, among the 13 indicating lamps 61, is "lighted-up", for example. The display mode of the fifth indicating lamp 61e corresponding to the present gain value is either "dimmer 1 lighted-up", "dimmer 2 lighted-up", or "lighted-up" depending on the value of the present gain value.

Among the 13 indicating lamps 61, the display mode of the indicating lamps 61 excluding the indicating lamp 61 corresponding to the present gain value, the indicating lamps 61 corresponding to smaller gain values than the present gain value, and the indicating lamp 61 corresponding to the first reference value is "lighted-off". That is, when the indicating lamp 61 corresponding to the present gain value is the "fifth indicating lamp 61e" and the indicating lamp 61 corresponding to the first reference value is the "seventh indicating lamp 61g", the display mode of the "sixth indicating lamp 61f", the "eighth indicating lamp 61h", the "ninth indicating lamp 61i", the "tenth indicating lamp 61j", the "eleventh indicating lamp 61k", the "twelfth indicating lamp 61l", and the "thirteenth indicating lamp 61m" is "lighted-off", for example.

Figure 8:
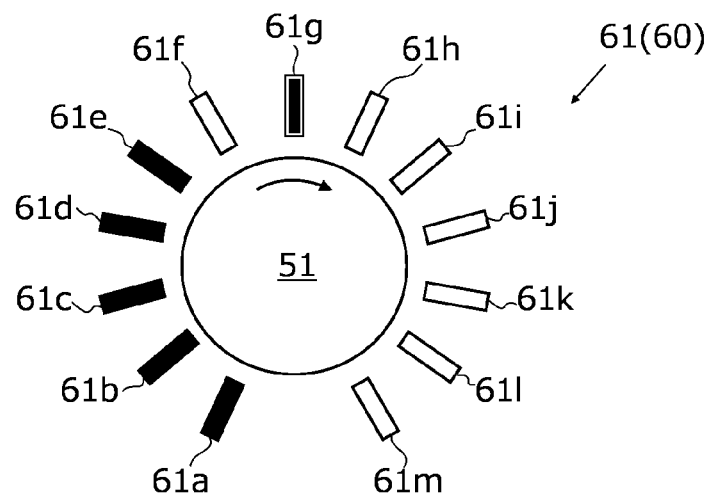
FIG. 8 is a schematic view illustrating an example of a display result displayed on a display included in the signal processing device illustrated in FIG. 1 during the first gain adjustment processing illustrated in FIG. 6.

FIG. 8 is a schematic view illustrating a display result displayed on the display 60 during the first gain adjustment processing (S11). In FIG. 8, among the display modes of the indicating lamp 61, "turned-on" is indicated with a black rectangle, "lighted-off" is indicated with a white rectangle, and "flashing" is indicated with a black rectangle with white peripheral edges (the same indication applies below).

FIG. 8 illustrates that the present gain value is +36 dB, the first indicating lamp 61a to the fifth indicating lamp 61e are lighted up, and the seventh indicating lamp 61g corresponding to the first reference value is flashing. That is, FIG. 8 illustrates that the present gain value and the first reference value do not match each other, and specifically illustrates that the present gain value has not reached the first reference value.

Referring back to FIG. 6, the present device 1 then adjusts (changes) the present gain value in response to an adjustment operation of the adjustment dial 51 by a user (S114). At this time, the user rotates the adjustment dial 51 clockwise in FIG. 3 (the same applies below) to adjust the present gain value.

The present device 1 then lights up the indicating lamp 61 corresponding to the adjusted present gain value (S115).

The present device 1 determines whether the present gain value and the first reference value match each other (S116).

Figure 9:
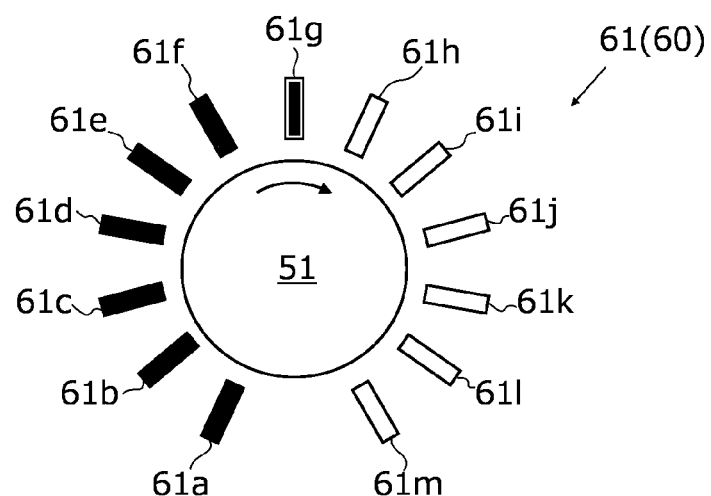
FIG. 9 is a schematic view illustrating another example of a display result displayed on the display included in the signal processing device illustrated in FIG. 1 during the first gain adjustment processing illustrated in FIG. 6.

FIG. 9 is another schematic view illustrating a display result displayed on the display 60 during the first gain adjustment processing (S11).

FIG. 9 illustrates that the present gain value is +39 dB, the first indicating lamp 61a to the sixth indicating lamp 61f are lighted up, and the seventh indicating lamp 61g corresponding to the first reference value is flashing. That is, FIG. 9 illustrates that the present gain value and the first reference value do not match each other, and specifically illustrates that the present gain value has not reached the first reference value.

Referring back to FIG. 6, when the present gain value and the first reference value are determined not to match each other ("No" in S116), the present device 1 readjusts the present gain value in response to an adjustment operation by a user until the present gain value and the first reference value match each other (S114). At this time, the user rotates the adjustment dial 51 clockwise to adjust the present gain value.

Figure 10:
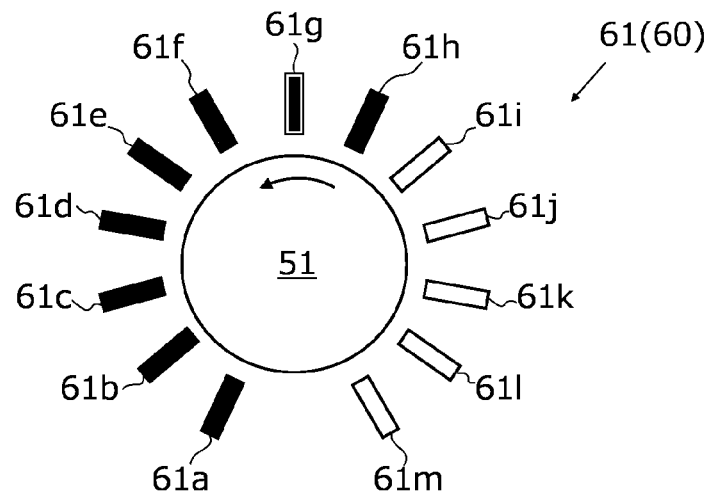
FIG. 10 is a schematic view illustrating still another example of a display result displayed on the display included in the signal processing device illustrated in FIG. 1 during the first gain adjustment processing illustrated in FIG. 6.

FIG. 10 is still another schematic view illustrating a display result displayed on the display 60 during the first gain adjustment processing (S11).

FIG. 10 illustrates that the present gain value is +45 dB, that the first indicating lamp 61a to the sixth indicating lamp 61f and the eighth indicating lamp 61h are lighted up, and that the seventh indicating lamp 61g corresponding to the first reference value is flashing. That is, FIG. 10 illustrates that the present gain value and the first reference value do not match each other, and specifically illustrates that the present gain value has exceeded the first reference value.

Referring back to FIG. 6, when the present gain value and the first reference value are determined not to match each other ("No" in S116), the present device 1 readjusts the present gain value in response to an adjustment operation by a user until the present gain value and the first reference value match each other (S114). At this time, the user rotates the adjustment dial 51 counterclockwise to adjust the present gain value.

Figure 11:
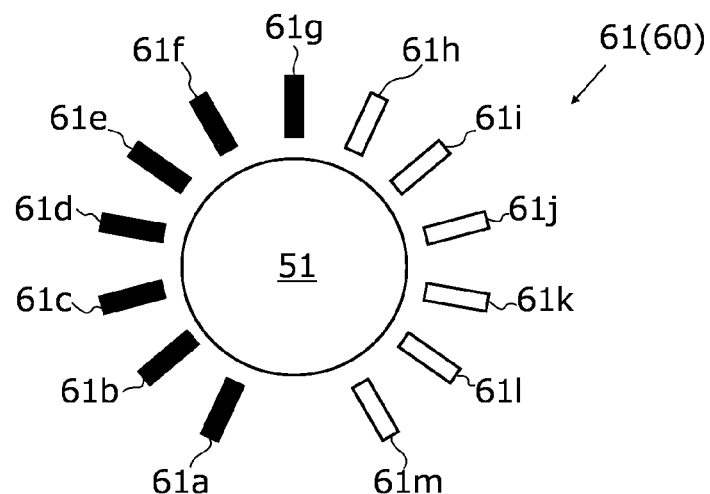
FIG. 11 is a schematic view illustrating still another example of a display result displayed on the display included in the signal processing device illustrated in FIG. 1 during the first gain adjustment processing illustrated in FIG. 6.

FIG. 11 is still another schematic view illustrating a display result displayed on the display 60 during the first gain adjustment processing (S11).

FIG. 11 illustrates that the present gain value is +40 dB, and that the first indicating lamp 61a to the seventh indicating lamp 61g are lighted up. That is, FIG. 11 illustrates that the present gain value and the first reference value match each other.

Referring back to FIG. 6, when the present gain value and the first reference value are determined to match each other ("Yes" in S116), the present device 1 lights up the seventh indicating lamp 61g, which has been flashing, corresponding to the first reference value (S117). The present gain value that matches the first reference value is stored in the storage 40 as a gain value of the selected input channel based on a confirmation operation such as a pressing down of the adjustment dial 51 by a user.

Second Gain Adjustment Processing

The following describes the second gain adjustment processing (S12). The second gain adjustment processing (S12) is processing for adjusting the gain value of each input channel, the gain value having been adjusted in the first gain adjustment processing (S11) and stored in the storage 40, such that a sound signal level from an input device connected to an input channel to be subjected to setting matches the second reference value.

Figure 12:
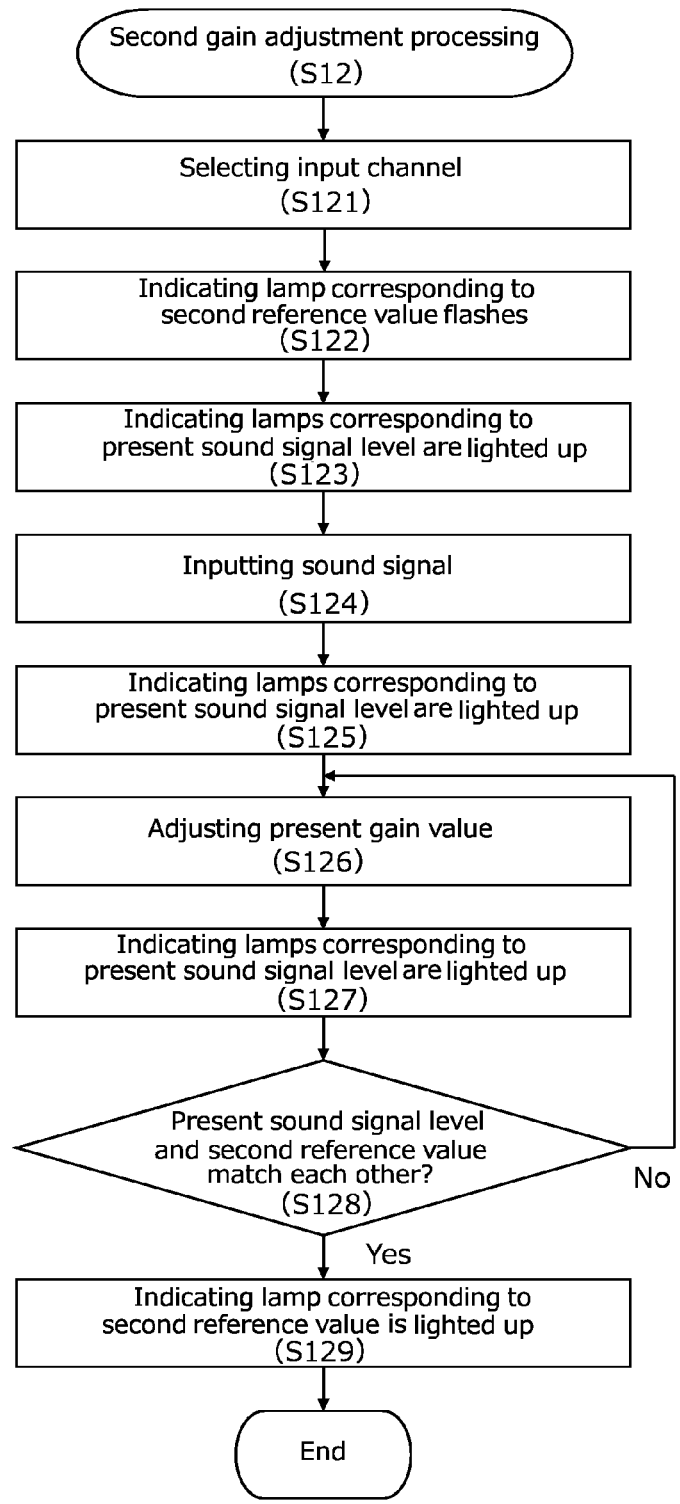
FIG. 12 is a flow chart illustrating second gain adjustment processing included in the gain adjustment processing illustrated in FIG. 5.

FIG. 12 is a flow chart illustrating the second gain adjustment processing (S12).

First, the present device 1 selects an input channel to be subjected to adjustment (S121). That is, the present device 1 selects, as an input channel to be subjected to adjustment, an input channel corresponding to one of the input channel buttons 21 pressed down by a user.

It should be noted that selection of an input channel is omitted when the second gain adjustment processing is successively performed on the same input channel after the first gain adjustment processing.

The present device 1 causes one of the indicating lamps 61 corresponding to the second reference value to flash (S122). At the same time, the present device 1 lights up one or more indicating lamps 61 corresponding to a sound signal level (the present sound signal level) of an input signal from the input device connected to the selected input channel (S123). At this stage, the present device 1 lights up only the first indicating lamp 61a when input signal from the input device is not present.

FIG. 13 is a schematic view illustrating display mode information used in the second gain adjustment processing (S12).

FIG. 13 illustrates that sound signal levels, information identifying the indicating lamps 61, and display modes of the indicating lamps 61 are stored in the storage 40 in a manner associated with one another.

FIG. 13 illustrates that one indicating lamp 61 corresponds to a plurality of sound signal level ranges (however, among the 13 indicating lamps 61a to 61m, the first indicating lamp 61a, the seventh indicating lamp 61g, and the thirteenth indicating lamp 61m correspond to one sound signal level range) and to display modes corresponding to the respective sound signal level ranges. That is, the display modes of the fifth indicating lamp 61e (the indicating lamp "5" in FIG. 13) are "dimmer 1 lighted-up" when the sound signal level is "−29 dBFS to −28 dBFS", "dimmer 2 lighted-up" when the sound signal level is "−28 dBFS to −26 dBFS", and "lighted-up" when the sound signal level is "−26 dBFS to −25 dBFS", for example. That is, the display mode of the indicating lamp 61 differs depending on the corresponding sound signal level (setting value).

It should be noted that the sound signal level ranges corresponding to one indicating lamp and the display modes corresponding to the respective sound signal level ranges are not limited to dimmer lighted up. That is, the sound signal level ranges corresponding to one indicating lamp and the display modes corresponding to the respective sound signal level ranges may be such that the indicating lamp is lighted up with a different light color depending on the sound signal level.

FIG. 13 further illustrates that the second reference value is "−22 dBFS to −18 dBFS". FIG. 13 illustrates that the display mode of the "seventh indicating lamp 61g" corresponding to the second reference value "−22 dBFS to −18 dBFS" is "lighted-up" when the sound signal level being adjusted (the present sound signal level) matches the second reference value, and is "flashing" when the present sound signal level is a value other than the second reference value. That is, the display mode of the seventh indicating lamp 61g corresponding to the second reference value repeats "flashing" until the present sound signal level matches the second reference value, and changes to "lighted-up" when the present sound signal level matches the second reference value, as will be described later. A user of the present device 1 can recognize that the present sound signal level has matched the second reference value from the change of the seventh indicating lamp 61g, among the indicating lamps 61a to 61m, from flashing to lighted-up. That is, the user of the present device 1 can recognize that adjustment of the gain value in the second gain adjustment processing has been completed.

Here, when the indicating lamp 61 corresponding to the present sound signal level is the "fifth indicating lamp 61e", the display mode of the "first indicating lamp 61a", the "second indicating lamp 61b", the "third indicating lamp 61c", and the "fourth indicating lamp 61d", which correspond to smaller sound signal levels than the present sound signal level, among the 13 indicating lamps 61, is "lighted-up", for example. The display mode of the fifth indicating lamp 61e corresponding to the present sound signal level is either "dimmer 1 lighted-up", "dimmer 2 lighted-up", or "lighted-up" depending on the present sound signal level.

Among the 13 indicating lamps 61, the display mode of the indicating lamps 61 excluding the indicating lamp 61 corresponding to the present sound signal level, the indicating lamps 61 corresponding to smaller sound signal levels than the present sound signal level, and the indicating lamp 61 corresponding to the second reference value is "lighted-off". That is, when the indicating lamp 61 corresponding to the present sound signal level is the "fifth indicating lamp 61e", and the indicating lamp 61 corresponding to the second reference value is the "seventh indicating lamp 61g", the display mode of the "sixth indicating lamp 61f", the "eighth indicating lamp 61h", the "ninth indicating lamp 61i", the "tenth indicating lamp 61j", the "eleventh indicating lamp 61k", the "twelfth indicating lamp 61l", and the "thirteenth indicating lamp 61m" is "lighted-off", for example.

Referring back to FIG. 12, a sound signal from the input device is then input to the present device 1 (S124).

The present device 1 then lights up the indicating lamp 61 corresponding to the present sound signal level of the input sound signal (S125).

The present device 1 then adjusts the present gain value in response to an adjustment operation by a user (S126).

The present device 1 then lights up the indicating lamp 61 corresponding to the present sound signal level with the adjusted present gain value, of the sound signal (S127).

The present device 1 determines whether the present sound signal level and the second reference value match each other (S128).

Figure 14:
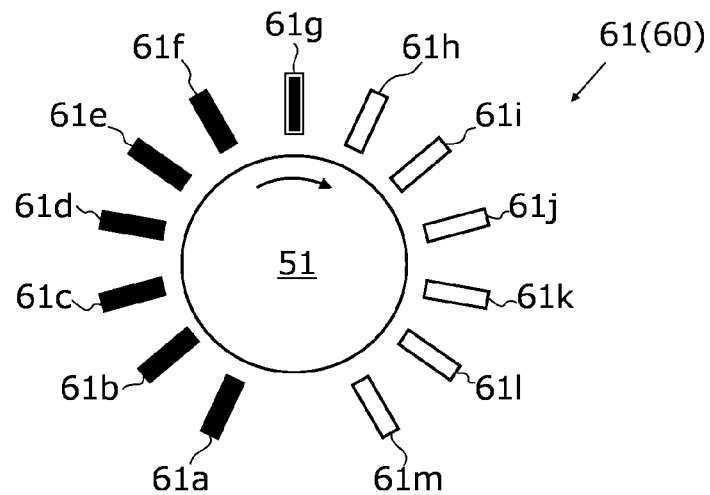
FIG. 14 is a schematic view illustrating an example of a display result displayed on the display included in the signal processing device illustrated in FIG. 1 during the second gain adjustment processing illustrated in FIG. 13.

FIG. 14 is a schematic view illustrating a display result displayed on the display 60 during the second gain adjustment processing (S12).

FIG. 14 illustrates that the present sound signal level is within the range of −23 dBFS to −22 dBFS, that the first indicating lamp 61a to the sixth indicating lamp 61f are lighted-up, and that the seventh indicating lamp 61g corresponding to the second reference value is flashing. That is, FIG. 14 illustrates that the present sound signal level and the second reference value do not match each other, and specifically illustrates that the present sound signal level has not reached the second reference value.

Referring back to FIG. 12, when the present sound signal level and the second reference value are determined not to match each other ("No" in S128), the present device 1 readjusts the present gain value in response to an adjustment operation by a user until the present sound signal level and the second reference value match each other (S126). At this time, the user rotates the adjustment dial 51 clockwise to adjust the present sound signal level.

Figure 15:
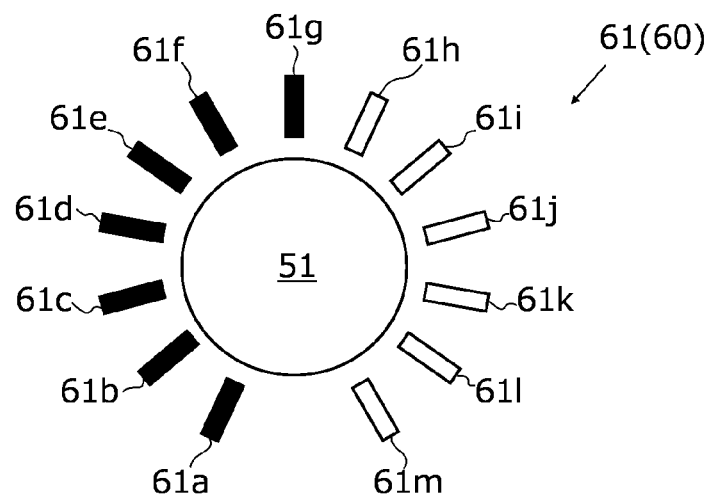
FIG. 15 is a schematic view illustrating another example of a display result displayed on the display included in the signal processing device illustrated in FIG. 1 during the second gain adjustment processing illustrated in FIG. 13.

FIG. 15 is another schematic view illustrating a display result displayed on the display 60 during the second gain adjustment processing (S12).

FIG. 15 illustrates that the present sound signal level is within the range of −22 dBFS to −18 dBFS, and that the first indicating lamp 61a to the seventh indicating lamp 61g are lighted up. That is, FIG. 15 illustrates that the present sound signal level and the second reference value match each other.

Referring back to FIG. 12, when the present sound signal level and the second reference value are determined to match each other ("Yes" in S128), the present device 1 lights up the seventh indicating lamp 61g, which has been flashing, corresponding to the second reference value (S129). The adjusted present gain value is stored in the storage 40 as a gain value of the selected input channel based on a confirmation operation such as a pressing down of the adjustment dial 51 by a user.

Level Adjustment Processing

The following describes the level adjustment processing (S2).

The level adjustment processing (S2) is processing for adjusting a volume value (a level value of a sound signal) for each input channel and each output channel.

Figure 16:
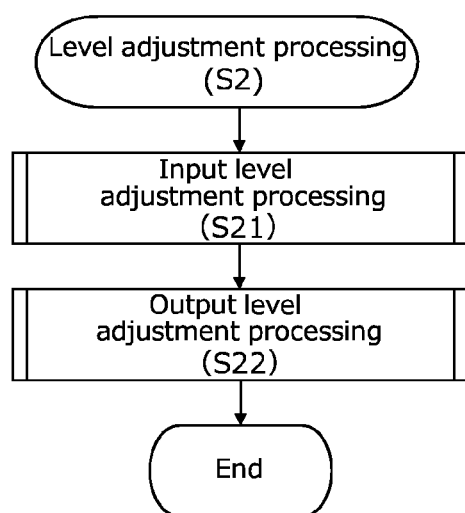
FIG. 16 is a flow chart illustrating level adjustment processing included in the adjustment processing illustrated in FIG. 4.

FIG. 16 is a flow chart illustrating the level adjustment processing (S2).

First, the present device 1 performs the input level adjustment processing (S21). Specific details of the input level adjustment processing will be described later.

Then, the present device 1 performs the output level adjustment processing (S22). Specific details of the output level adjustment processing will be described later.

Input Level Adjustment Processing

The following describes the input level adjustment processing (S21).

The input level adjustment processing (S21) is processing for adjusting a volume value (the present input level value) that has been set for each input channel and stored in the storage 40 such that the input level value matches the third reference value.

Figure 17:
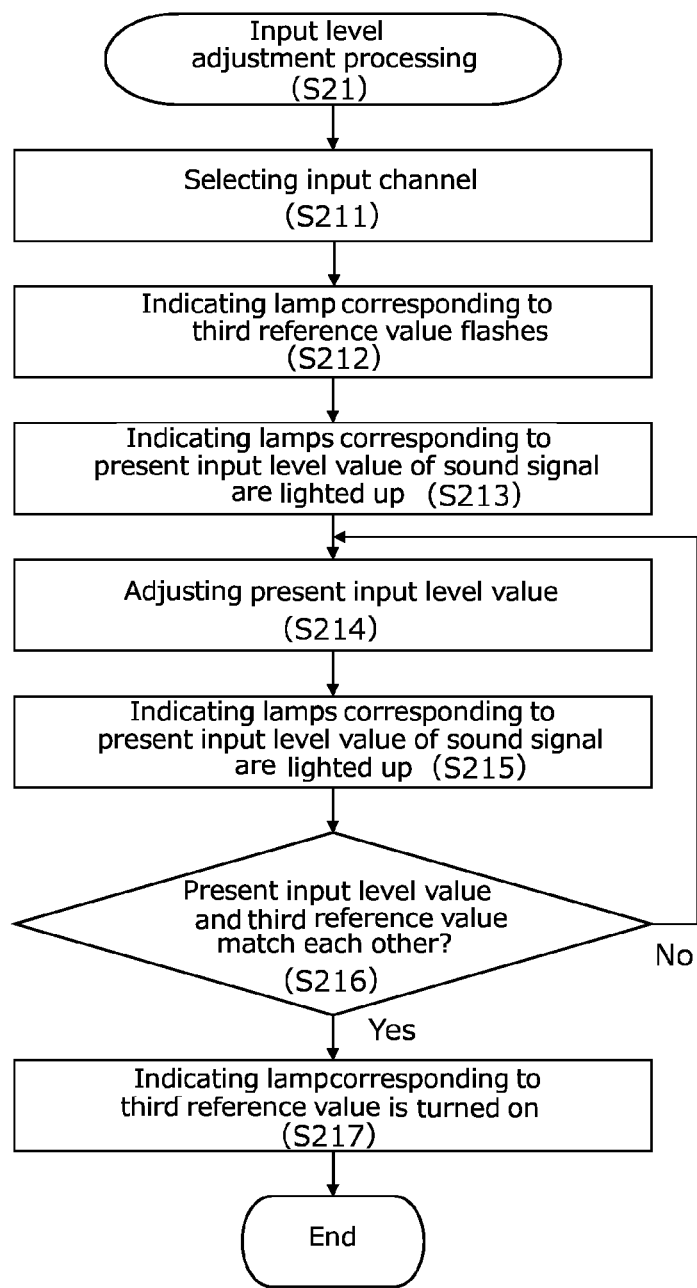
FIG. 17 is a flow chart illustrating input level adjustment processing included in the level adjustment processing illustrated in FIG. 16.

FIG. 17 is a flow chart illustrating the input level adjustment processing (S21).

First, the present device 1 selects an input channel to be subjected to adjustment (S211). That is, the present device 1 selects, as an input channel to be subjected to adjustment, an input channel corresponding to one of the input channel buttons 21 pressed down by a user.

Then, the present device 1 causes one of the indicating lamps 61 corresponding to the third reference value to flash (S212). At the same time, the present device 1 lights up one or more indicating lamps 61 corresponding to the present input level value of the selected input channel (S213).

FIG. 18 is a schematic view illustrating display mode information used in the input level adjustment processing (S21).

FIG. 18 illustrates that input level values, information identifying the indicating lamps 61, and display modes of the indicating lamps 61 are stored in the storage 40 in a manner associated with one another.

FIG. 18 illustrates that one indicating lamp 61 corresponds to a plurality of input level values (among the 13 indicating lamps 61a to 61m, the first indicating lamp 61a corresponds to four input level values, and the other indicating lamps 61b to 61m correspond to three input level values) and to display modes corresponding to the respective input level values. That is, the display modes of the fifth indicating lamp 61e (the indicating lamp "5" in FIG. 18) are "dimmer 1 lighted-up" when the input level value is "−26 dBu", "dimmer 2 lighted-up" when the input level value is "−24 dBu", and "lighted-up" when the input level value is "−22 dBu", for example. That is, the display mode of the indicating lamp 61 differs depending on the corresponding input level value (setting value).

It should be noted that the input level values corresponding to one indicating lamp and the display modes corresponding to the respective input level values are not limited to dimmer lighted-up. That is, the input level values corresponding to one indicating lamp and the display modes corresponding to the respective input level values may be such that the indicating lamp is lighted up with a different light color depending on the input level value.

FIG. 18 further illustrates that the third reference value is "0 dBu". FIG. 18 illustrates that the display mode of the "seventh indicating lamp 61g" corresponding to the third reference value "0 dBu" is "lighted-up" when the input level value being adjusted (the present input level value) matches the third reference value, and is "flashing" when the present input level value is a value other than the third reference value. That is, the display mode of the seventh indicating lamp 61g corresponding to the third reference value repeats "flashing" until the present input level value matches the third reference value, and changes to "lighted-up" when the present input level value matches the third reference value, as will be described later. A user of the present device 1 can recognize that the present input level value has matched the third reference value from the change of the seventh indicating lamp 61g, among the indicating lamps 61a to 61m, from flashing to lighted-up. That is, the user of the present invention can recognize that adjustment of the input level value in the input level adjustment processing has been completed.

When the indicating lamp 61 corresponding to the present input level value is the "fifth indicating lamp 61e", the display mode of the "first indicating lamp 61a", the "second indicating lamp 61b", the "third indicating lamp 61c", and the "fourth indicating lamp 61d", which correspond to smaller input level values than the present input level value, among the 13 indicating lamps 61 is "lighted-up", for example. The display mode of the fifth indicating lamp 61e corresponding to the present input level value is either "dimmer 1 lighted-up", "dimmer 2 lighted-up", or "lighted-up" depending on the present input level value.

Among the 13 indicating lamps 61, the display mode of the indicating lamps 61 excluding the indicating lamp 61 corresponding to the present input level value, the indicating lamps 61 corresponding to smaller input level values than the present input level value, and the indicating lamp 61 corresponding to the third reference value is "lighted-up". That is, when the indicating lamp 61 corresponding to the present input level value is the "fifth indicating lamp 61e", and the indicating lamp 61 corresponding to the third reference value is the "seventh indicating lamp 61g", the display mode of the "sixth indicating lamp 61f", the "eighth indicating lamp 61h", the "ninth indicating lamp 61i", the "tenth indicating lamp 61j", the "eleventh indicating lamp 61k", the "twelfth indicating lamp 61l", and the "thirteenth indicating lamp 61m" is "lighted-off", for example.

Referring back to FIG. 17, the present device 1 then adjusts the present input level value in response to an adjustment operation by a user (S214).

The present device 1 then lights up the indicating lamp 61 corresponding to the adjusted present input level value (S215).

The present device 1 then determines whether the present input level value and the third reference value match each other (S216).

When the present input level value and the third reference value are determined not to match each other ("No" in S216), the present device 1 readjusts the present input level value in response to an adjustment operation by a user until the present input level value and the third reference value match each other (S214).

When the present input level value and the third reference value are determined to match each other ("Yes" in S216), the present device 1 lights up the seventh indicating lamp 61g, which has been flashing, corresponding to the third reference value (S217). The present input level value that matches the third reference value is stored in the storage 40 as an input level value of the selected input channel based on a confirmation operation such as a pressing down of the adjustment dial 51 by a user.

Output Level Adjustment Processing

The following describes the output level adjustment processing (S22).

The output level adjustment processing (S22) is processing for adjusting a volume value (the present output level value) that has been set for each output channel and stored in the storage 40 such that the output level value matches the fourth reference value.

Figure 19:
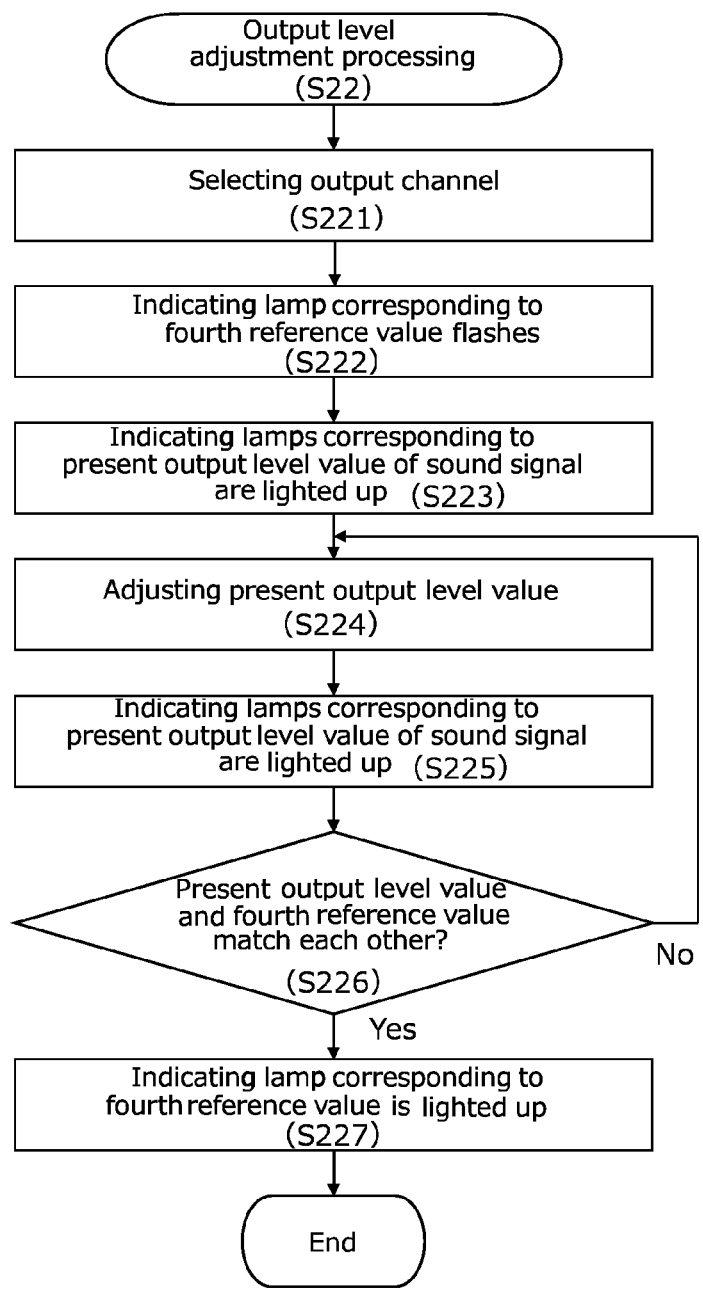
FIG. 19 is a flow chart illustrating output level adjustment processing included in the level adjustment processing illustrated in FIG. 16.

FIG. 19 is a flow chart illustrating the output level adjustment processing (S22).

First, the present device 1 selects an output channel to be subjected to adjustment (S221). That is, the present device 1 selects, as an output channel to be subjected to adjustment, an output channel corresponding to one of the output channel buttons 71 pressed down by a user.

The present device 1 then causes one of the indicating lamps 61 corresponding to the fourth reference value to flash (S222). At the same time, the present device 1 lights up one or more indicating lamps 61 corresponding to the present output level value of the selected output channel (S223).

FIG. 20 is a schematic view illustrating display mode information used in the output level adjustment processing (S22).

FIG. 20 illustrates that output level values, information identifying the indicating lamps 61, and display modes of the indicating lamps 61 are stored in the storage 40 in a manner associated with one another.

FIG. 20 illustrates that one indicating lamp 61 corresponds to a plurality of output level values (among the 13 indicating lamps 61a to 61m, the first indicating lamp 61a corresponds to four output level values, and the other indicating lamps 61b to 61m correspond to three output level values) and to display modes corresponding to the respective output level values. That is, the display mode of the fifth indicating lamp 61e (the indicating lamp "5" in FIG. 20) is "dimmer 1 lighted-up" when the output level value is "−26 dBu", "dimmer 2 lighted-up" when the output level value is "−24 dBu", and "lighted-up" when the output level value is "−22 dBu", for example. That is, the display mode of the indicating lamp 61 differs depending on the corresponding output level value (setting value).

It should be noted that the output level values corresponding to one indicating lamp and the display modes corresponding to the respective output level values are not limited to dimmer lighted-up. That is, the output level values corresponding to one indicating lamp and the display modes corresponding to the respective output level values may be such that the indicating lamp is lighted up with a different light color depending on the output level value.

FIG. 20 further illustrates that the fourth reference value is "0 dBu". FIG. 20 illustrates that the display mode of the "seventh indicating lamp 61g" corresponding to the fourth reference value "0 dBu" is "lighted-up" when the output level value being adjusted (the present output level value) matches the fourth reference value, and is "flashing" when the present output level value is a value other than the fourth reference value. That is, the display mode of the seventh indicating lamp 61g corresponding to the fourth reference value repeats "flashing" until the present output level value matches the fourth reference value, and changes to "lighted-up" when the present output level value matches the fourth reference value, as will be described later. A user of the present device 1 can recognize that the present output level value has matched the fourth reference value from the change from flashing to lighted-up of the seventh indicating lamp 61g, among the indicating lamps 61a to 61m, from flashing to lighted-up. That is, the user of the present invention can recognize that adjustment of the output level value in the output level adjustment processing has been completed.

When the indicating lamp 61 corresponding to the present output level value is the "fifth indicating lamp 61*e*", the display mode of the "first indicating lamp 61*a*", the "second indicating lamp 61*b*", the "third indicating lamp 61*c*", and the "fourth indicating lamp 61*d*", which correspond to smaller output level values than the present output level value, among the 13 indicating lamps 61 is "lighted-up", for example. The display mode of the fifth indicating lamp 61*e* corresponding to the present output level value is one of "dimmer 1 lighted-up", "dimmer 2 lighted-up", and "lighted-up" depending on the present output level value.

Among the 13 indicating lamps 61, the display mode of the indicating lamps 61 excluding the indicating lamp 61 corresponding to the present output level value, the indicating lamps 61 corresponding to smaller output level values than the present output level value, and the indicating lamp 61 corresponding to the fourth reference value is "lighted-off". That is, when the indicating lamp 61 corresponding to the present output level value is the "fifth indicating lamp 61*e*", and the indicating lamp 61 corresponding to the fourth reference value is the "seventh indicating lamp 61*g*", the display mode of the "sixth indicating lamp 61*f*", the "eighth indicating lamp 61*h*", the "ninth indicating lamp 61*i*", the "tenth indicating lamp 61*j*", the "eleventh indicating lamp 61*k*", the "twelfth indicating lamp 61*l*", and the "thirteenth indicating lamp 61*m*" is "lighted-off", for example.

Referring back to FIG. 19, the present device 1 adjusts the present output level value in response to an adjustment operation by a user (S224).

The present device 1 then lights up the indicating lamp 61 corresponding to the adjusted present output level value (S225).

The present device 1 then determines whether the present output level value and the fourth reference value match each other (S226).

When the present output level value and the fourth reference value are determined not to match each other ("No" in S226), the present device 1 readjusts the present output level value in response to an adjustment operation by a user until the present output level value and the fourth reference value match each other (S224).

When the present output level value and the fourth reference value are determined to match each other ("Yes" in S226), the present device 1 lights up the seventh indicating lamp 61*g*, which has been flashing, corresponding to the fourth reference value (S227). The present output level value that matches the fourth reference value is stored in the storage 40 as an output level value of the selected output channel based on a confirmation operation such as a pressing down of the adjustment dial 51 by a user.

As described above, when a setting value and a reference value do not match each other, the display mode of the indicating lamp 61 corresponding to the reference value is "flashing", and the display modes of the indicating lamps other than the indicating lamp 61 corresponding to the reference value are either "lighted-off", "dimmer 1 lighted-up", "dimmer 2 lighted-up", or "lighted-up". On the other hand, when a setting value and a reference value match each other, the display mode of the indicating lamp 61 corresponding to the reference value is "lighted-up", the display mode of one or more indicating lamps 61 corresponding to a smaller value (setting value) than the reference value are "lighted-up", and the display mode of one or more indicating lamps 61 corresponding to a larger value (setting value) than the reference value are "lighted-off". That is, the display mode of each indicating lamp 61 differs depending on the relation between the setting value corresponding to the indicating lamp 61 and the reference value.

SUMMARY

According to the embodiment described above, the present device 1 displays a setting value of a parameter being adjusted, and a reference value of the setting value on the display 60 at the same time. Thus, the present device 1 allows a user to adjust the setting value of the parameter while checking a degree of difference between the setting value of the parameter being adjusted and the reference value of the setting value.

Further, the present device 1 displays a display result in a non-specific display mode until the setting value of the parameter being adjusted matches the reference value. Only when the setting value of the parameter being adjusted matches the reference value, the present device 1 displays a display result in a specific display mode. Thus, a user of the present device 1 can recognize that the adjustment of the setting value of the parameter has been completed from the change of the display result of the present device 1 from the non-specific display mode to the specific display mode.

The present device 1 uses the same display 60 in either target adjustment processing, the "gain adjustment processing (the first gain adjustment processing, the second gain adjustment processing)" and the "level adjustment processing (the input level adjustment processing, the output level adjustment processing)". Thus, the present device 1 has no need to include a display member such as scales that are different for each target adjustment processing. As a result, the present device 1 excels in visibility and designability.

It should be noted that, in the embodiment of the present device 1 described above, target adjustment processing includes the "gain adjustment processing (the first gain adjustment processing, the second gain adjustment processing)" and the "level adjustment processing (the input level adjustment processing, the output level adjustment processing)". However, in the present device, target adjustment processing is not limited to the above-described processing, and may include adjustment processing on an equalizer, for example. In this case, for the adjustment processing on the equalizer, the present device can also use the display 60 including the same indicating lamps 61 used for the "gain adjustment processing" and the "level adjustment processing".

In the present device 1 according to the embodiment described above, the display 60 includes 13 indicating lamps. However, instead of the 13 indicating lamps, the display may include 12 or less indicating lamps or 14 or more indicating lamps.

The invention claimed is:

1. A signal mixer comprising:
    an input part to which an input signal is input;
    a storage that stores therein one or more setting values of a parameter to be used for amplifying the input signal, and a reference value of the setting value;
    an amplification part that generates an output signal by amplifying a level of the input signal based on the setting value;
    an output part that outputs the output signal;
    an adjustment part that adjusts the setting value; and
    a display that displays a display result determined based on the setting value adjusted by the adjustment part and the reference value, wherein the display result includes:
  a specific display result displayed when a relation between the setting value and the reference value is a specific relation, and
  a non-specific display result displayed when the relation between the setting value and the reference value is different from the specific relation, wherein
the storage stores therein a plurality of the setting values of the parameter,
the display includes a plurality of the indicating lamps, and
a display mode of the respective indicating lamps differs depending on a difference between each of the setting values adjusted by the adjustment part and the reference value.

2. The signal mixer according to claim 1, wherein the display mode includes lighted-up, flashing, and dimmer lighted-up.

* * * * *